(12) United States Patent
Vassighi et al.

(10) Patent No.: US 7,268,569 B2
(45) Date of Patent: Sep. 11, 2007

(54) LEAKAGE CURRENT MANAGEMENT (75) Inventors: Arman Vassighi, Beaverton, OR (US); Ali Keshavarzi, Portland, OR (US); Vivek K De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 76 days.

(21) Appl. No.: 11/027,696

(22) Filed: Dec. 28, 2004

(65) Prior Publication Data
US 2006/0140041 A1    Jun. 29, 2006

(51) Int. Cl.
*G01R 31/02* (2006.01)
(52) U.S. Cl. .................................... 324/760
(58) Field of Classification Search ............. None
See application file for complete search history.

(56) References Cited

U.S. PATENT DOCUMENTS

| | | | |
|---|---|---|---|
| 6,217,213 B1* | 4/2001 | Curry et al. ............... | 374/178 |
| 6,218,892 B1* | 4/2001 | Soumyanath et al. ....... | 327/537 |
| 6,310,485 B1* | 10/2001 | McClure .................... | 324/760 |
| 6,809,538 B1* | 10/2004 | Borkar ...................... | 324/760 |
| 6,812,722 B2* | 11/2004 | Throngnumchai et al. .. | 324/760 |
| 6,900,650 B1* | 5/2005 | Sheng et al. ................ | 324/760 |
| 7,042,274 B2* | 5/2006 | Hazucha et al. ............ | 327/534 |
| 2004/0108866 A1* | 6/2004 | Burns et al. ................ | 324/763 |
| 2005/0062491 A1* | 3/2005 | Burns et al. ................ | 324/763 |
| 2005/0225347 A1* | 10/2005 | Khandros et al. .......... | 324/763 |

OTHER PUBLICATIONS

Semenov, Oleg, et al., "Burn-in Temperature Projections for Deep Sub-micron Technologies", *Test Conference, 2003. Proceedings. ITC 2003.* International vol. 1, Sep. 30-Oct. 2, 2003, pp. 95-104.
Vassighi, Arman, et al., "Thermal Management of High Performance Microprocessors in Burn-in Environment", *Defect and Fault Tolerance in VLSI Systems, 2003. Proceedings.* 18th IEEE International Symposium on Date: Nov. 3-5, 2003, pp. 313-319.
Vassighi, Arman, et al., "Thermal Runaway Avoidance During Burn-in", *Reliability Physics Symposium Proceedings*, 2004, 42nd Annual. 2004 IEEE International Apr. 25-29, 2004, (Apr. 2004), pp. 655-656.

* cited by examiner

*Primary Examiner*—Ha Tran Nguyen
*Assistant Examiner*—Richard Isla-Rodas
(74) *Attorney, Agent, or Firm*—LeMoine Patent Services, PLLC; Dana B. LeMoine (57) ABSTRACT

A thermal feedback loop controls leakage current during burn-in of a circuit.

12 Claims, 5 Drawing Sheets

LEAKAGE CURRENT MANAGEMENT

FIELD

The present invention relates generally to integrated circuits, and more specifically to leakage management in integrated circuits.

BACKGROUND

Integrated circuits are typically subjected to a "burn-in" process in which parts are stressed by applying various voltages and temperatures. These integrated circuits typically include transistors that have a "leakage current" that flows even when the transistors are turned off. Leakage current tends to increase with transistor junction temperature, and increased current in a transistor tends to increase the transistor junction temperature. When power supply voltages and temperatures are increased during burn-in, there may be a danger of thermal runaway that causes failure of good parts.

DESCRIPTION OF EMBODIMENTS

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Figure 1:
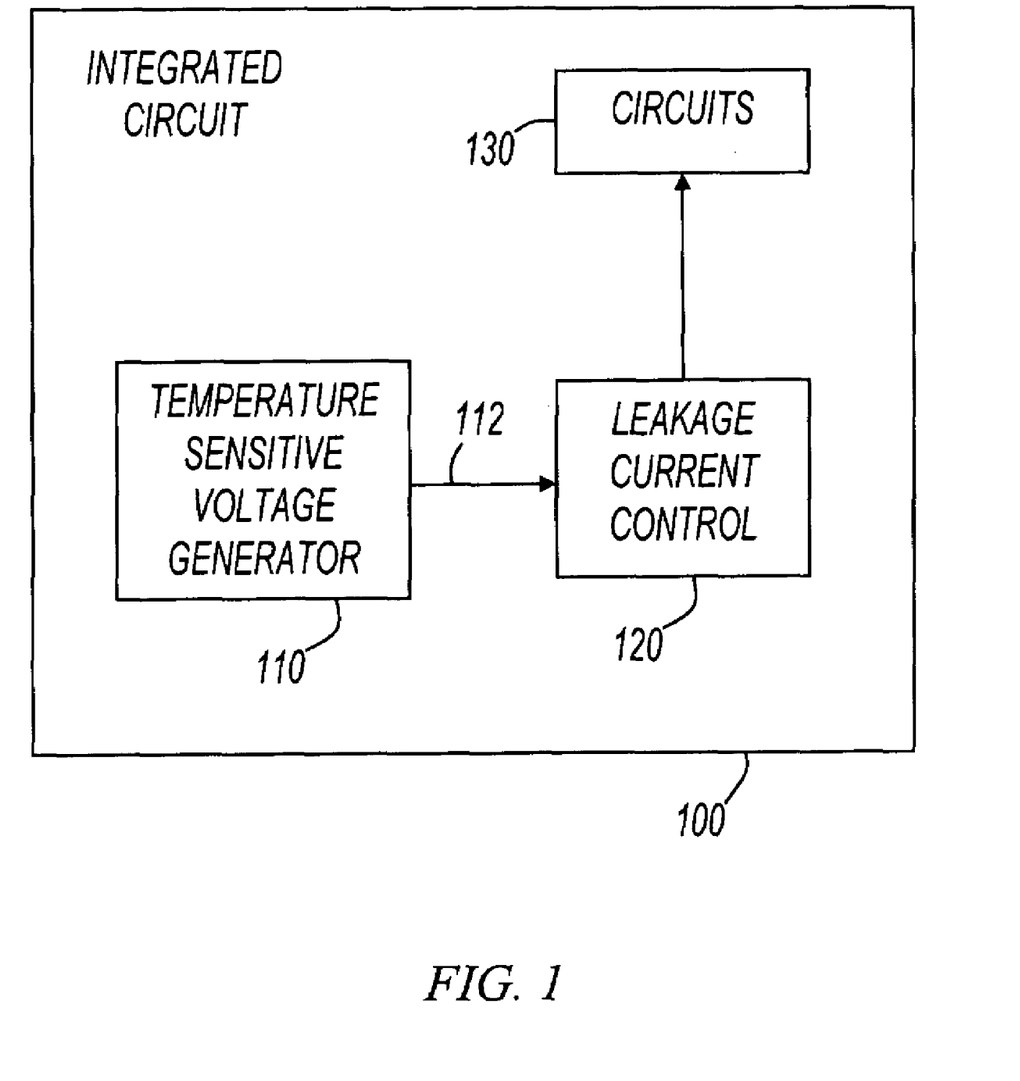
FIG. 1 shows a diagram of an integrated circuit having a leakage current control mechanism.

FIG. 1 shows a diagram of an integrated circuit having a leakage current control mechanism. As shown in FIG. 1, integrated circuit 100 includes circuits 130, temperature sensitive voltage generator 110, and leakage current control block 120. Circuits 130 represent any type of circuits that may exhibit a leakage current. For example, circuits 130 may represent all of the digital circuits within integrated circuit 100. Also for example, circuits 130 may represent a subset of digital circuits within integrated circuit 100, such as a functional block or a region on an integrated circuit die.

Leakage current control block 120 controls leakage current in circuits 130 in response to a voltage received from temperature sensitive voltage generator 110. In some embodiments, leakage current control block 120 may include transistors coupled in series between circuits 130 and power supply nodes, although this is not a limitation of the present invention. For example, leakage current control block 120 may include any circuit elements or functional blocks that may influence leakage currents of circuits 130 in response to a voltage received from temperature sensitive voltage generator 110.

Temperature sensitive voltage generator 110 produces a voltage on node 112 that is provided to leakage current control block 120. The voltage on node 112 varies with the temperature of circuits within temperature sensitive voltage generator 110. In some embodiments, the voltage on node 112 varies proportionally with the temperature, and in some embodiments the voltage varies inversely proportional with the temperature. The various blocks shown in FIG. 1 form a thermal feedback mechanism to control leakage current in circuits 130. For example, as the temperature of voltage generator 110 increases, the voltage on node 112 will change, thereby modifying leakage current in circuits 130.

In some embodiments, the elements shown in integrated circuit 100 are utilized to control leakage current during a burn-in test. For example, the output voltage of temperature sensitive voltage generator 110 may be programmed based on a nominal current value of integrated circuit 100, and during burn-in the thermal feedback mechanism described above may control the leakage current present in circuits 130.

Figure 2:
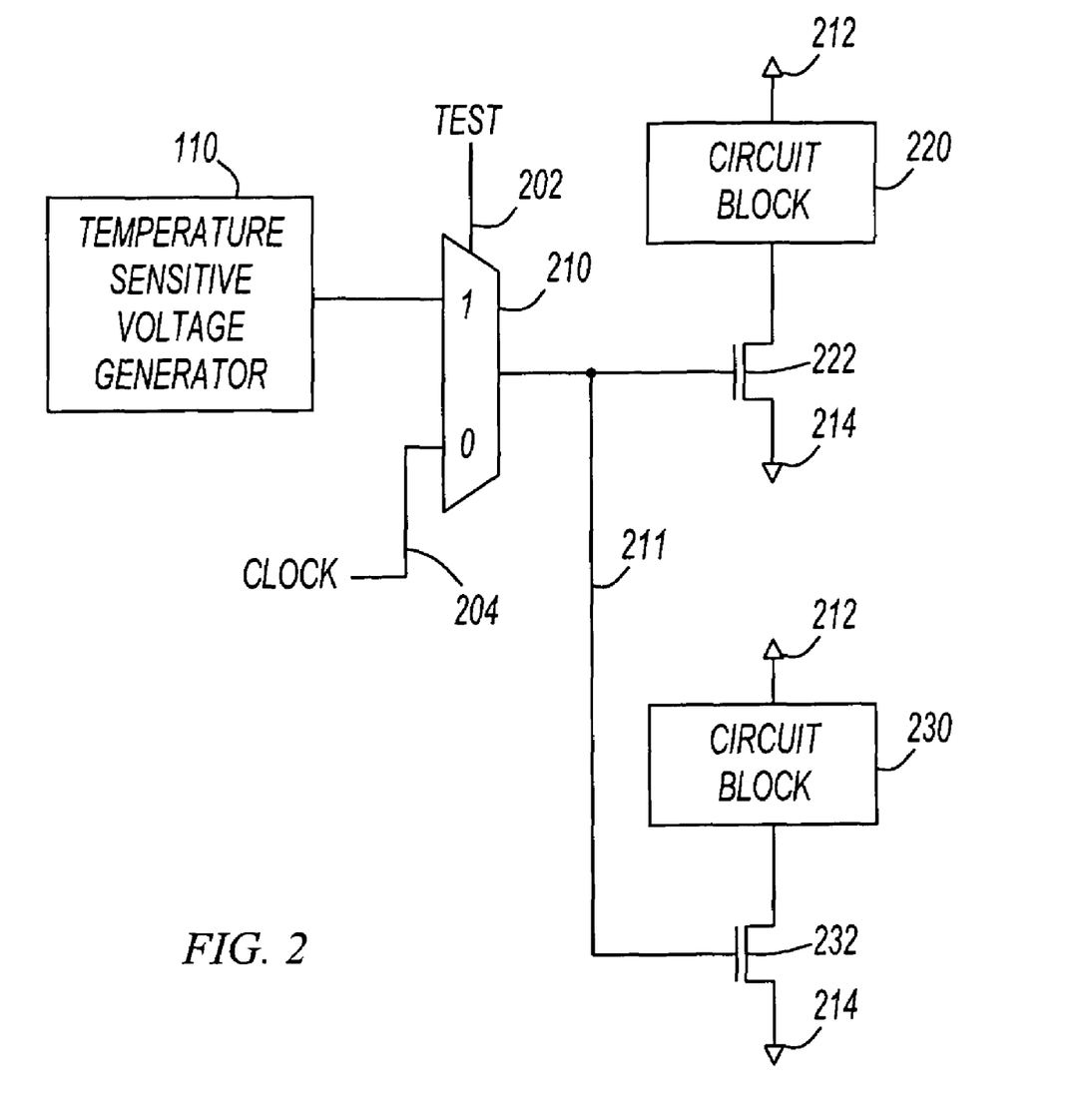
FIG. 2 shows a diagram of a leakage control mechanism having sleep transistors.

FIG. 2 shows a diagram of a leakage control mechanism having sleep transistors. Shown in FIG. 2 are temperature sensitive voltage generator 110, multiplexer 210, circuit blocks 220 and 230, and sleep transistors 222 and 232. Circuit blocks 220 and 230 represent any functional circuit block within an integrated circuit. For example, circuit block 220 may represent a memory device, an arithmetic logic unit (ALU), a register file, or any other type of circuit. Also for example, circuit block 220 may represent a region of an integrated circuit die. An integrated circuit die may be divided into multiple regions, where each region is represented by a circuit block such as circuit block 220 or 230. In these embodiments, leakage current may be controlled on a region by region basis within an integrated circuit.

Circuit blocks 220 and 230 are coupled between power supply nodes 212 and 214. Power supply node 212 is an upper power supply node, and power supply node 214 is a lower power supply node. As used herein, the terms "power supply" and "power supply node" may describe one or more circuit nodes, and do not necessarily refer to two nodes of a power supply, or a voltage between two power supply nodes.

Circuit blocks 220 and 230 are shown coupled directly to upper power supply node 212 and coupled to lower power supply 214 through sleep transistors. For example, sleep transistor 222 is coupled between circuit block 220 and lower power supply node 214, and sleep transistor 232 is coupled between circuit block 230 and lower power supply node 214. In operation, power supply current flows from upper power supply node 212 to lower power supply node 214. Sleep transistors 222 and 232 may reduce the amount of power supply current as a function of the voltage on node 211. For example, when the test signal on node 202 is asserted high, the sleep transistors are controlled by the voltage output of temperature sensitive voltage generator

110. As described with reference to FIG. 1 above, when sleep transistors 222 and 232 are controlled by the output voltage from temperature sensitive voltage generator 110, a thermal feedback mechanism exists to control the leakage current of circuit blocks 220 and 230.

The circuit shown in FIG. 2 may operate in two modes: a test mode, and a normal mode. During test mode, the test signal on node 202 may be asserted high, which selects the output of temperature sensitive voltage generator 110 to provide the voltage on node 211. In normal mode, the test signal on node 202 may be asserted low, to select the clock signal on node 204 to provide the signal on node 211. In operation, the thermal feedback mechanism reduces the current in sleep transistors 222 and 232 when the temperature increases within temperature sensitive voltage generator 110.

When in test mode, the thermal feedback mechanism that includes temperature sensitive voltage generator 110, multiplexer 210, and sleep transistors 222 and 232, is included within the circuit. When in normal mode, the thermal feedback mechanism is removed from the circuit. For example, when the test signal on node 202 is asserted low, temperature sensitive voltage generator 110 no longer influences the current flowing in sleep transistors 222 and 232. Although node 204 is shown with a clock signal, this is not a limitation of the present invention. For example, node 304 may have any signal useful for normal operation.

Figure 3:
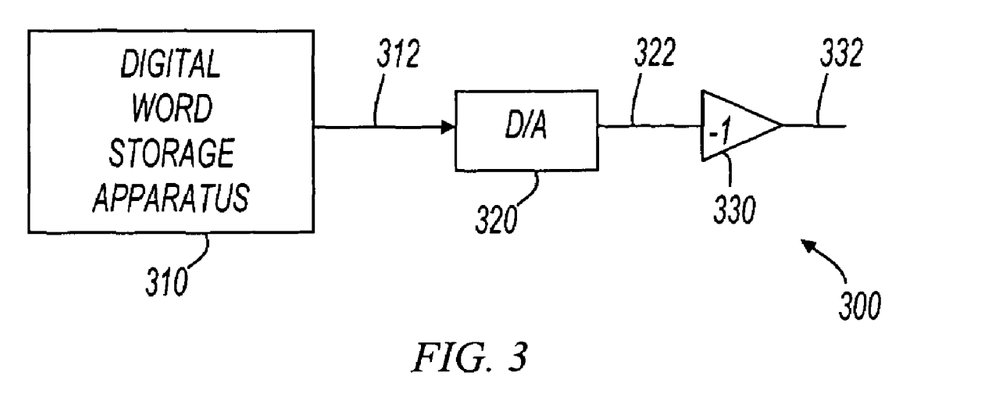
FIGS. 3-5 show temperature sensitive voltage generators in accordance with various embodiments of the present invention.
Figure 4:
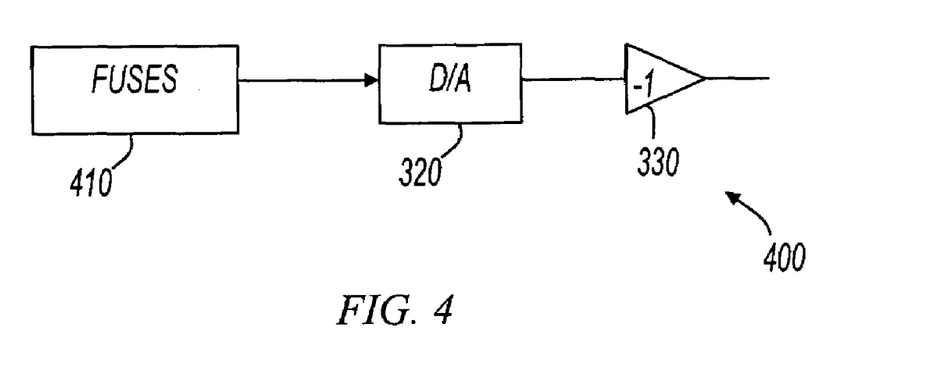
Figure 5:
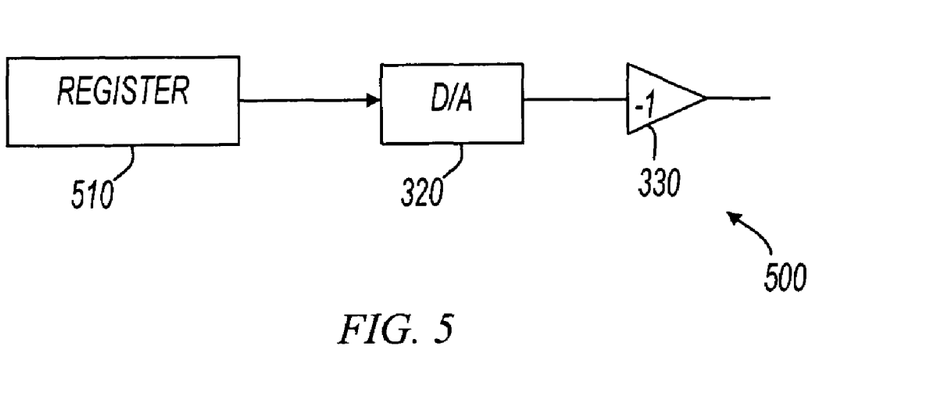

FIGS. 3-5 show temperature sensitive voltage generators in accordance with various embodiments of the present invention. As shown in FIG. 3, temperature sensitive voltage generator 300 includes digital word storage apparatus 310, digital to analog (D/A) converter 320, and amplifier 330. Digital word storage apparatus 310 may be any apparatus capable of storing a digital word. The digital word is provided on node 312 to D/A converter 320. Digital to analog converter 320 converts the digital word on node 312 to an analog voltage on node 322, and the analog voltage on node 322 varies as a function of temperature. For example, for a fixed digital word on node 312, the voltage on node 322 will increase as temperature increases, and decrease as temperature decreases because of a temperature dependent gain characteristic of A/D converter 320. Amplifier 330 inverts the gain characteristic as a function of temperature. For example, the voltage present on node 332 increases as the temperature decreases, and the voltage on node 332 decreases as the temperature increases. In embodiments represented by FIG. 3, the voltage output by temperature dependent voltage generator 300 varies inversely with temperature.

Referring now back to FIG. 2, when the output voltage from temperature sensitive voltage generator 110 increases, the current through sleep transistors 222 and 232 will also increase. Likewise, when the output voltage of temperature sensitive voltage generator 110 decreases, the current through sleep transistors 222 and 232 also decreases. When temperature sensitive voltage generator 300 (FIG. 3) is used for temperature sensitive voltage generator 110 (FIG. 2), a thermal feedback mechanism exists to control leakage current as a function of temperature.

In some embodiments, digital word storage apparatus 310 is programmed in response to an integrated circuit current measured during wafer sort. For example, the standby leakage current of an integrated circuit die or of an entire wafer may be measured during wafer sort, and the digital word held in digital word storage apparatus 310 may be set to control the leakage current during a subsequent burn-in test, so as to prevent thermal runaway.

FIGS. 4 and 5 show embodiments of temperature sensitive voltage generators having various types of digital word storage apparatus. For example, temperature sensitive voltage generator 400 (FIG. 4) includes fuses 410 to store a digital word as an input to D/A converter 320. Also, temperature sensitive voltage generator 500 (FIG. 5) includes a register 510 to hold a digital word as an input to D/A converter 320. Fuses 410 represent any type of digital word storage apparatus that once set, may not be modified. For example, in some embodiments, fuses 410 may include polysilicon fuses in an integrated circuit that may be blown to provide a digital word storage apparatus. Register 510 represents any type of storage which may be modified. For example, register 510 may be implemented as a scan register in a test circuit, a memory circuit, nonvolatile memory such as Flash memory, or any other type of digital word storage apparatus that may be modified.

Leakage control circuits, digital to analog converters, sleep transistors, and other embodiments of the present invention can be implemented in many ways. In some embodiments, they are implemented in integrated circuits. In some embodiments, design descriptions of the various embodiments of the present invention are included in libraries that enable designers to include them in custom or semi-custom designs. For example, any of the disclosed embodiments can be implemented in a synthesizable hardware design language, such as VHDL or Verilog, and distributed to designers for inclusion in standard cell designs, gate arrays, custom devices, or the like. Likewise, any embodiment of the present invention can also be represented as a hard macro targeted to a specific manufacturing process. For example, temperature sensitive voltage generator 110 (FIGS. 1, 2) may be represented as polygons assigned to layers of an integrated circuit.

Figure 6:
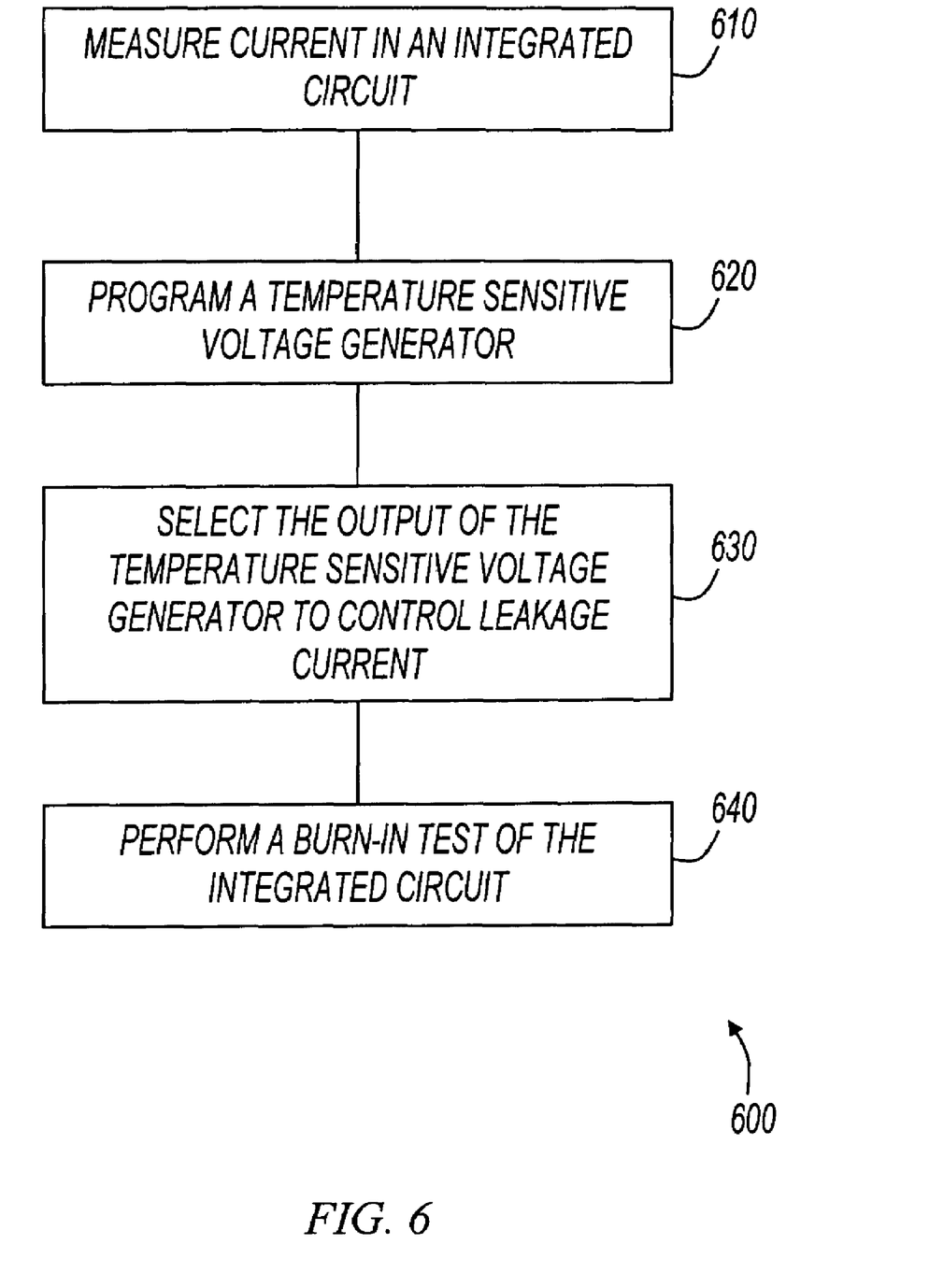
FIG. 6 shows a flowchart in accordance with various embodiments of the present invention.

FIG. 6 shows a flowchart in accordance with various embodiments of the present invention. In some embodiments, method 600 may performed by a control circuit, an integrated circuit, a chip tester, or an electronic system. Method 600 is not limited by the particular type of apparatus or software element performing the method. The various actions in method 600 may be performed in the order presented, or may be performed in a different order. Further, in some embodiments, some actions listed in FIG. 6 are omitted from method 600.

Method 600 is shown beginning with block 610. At 610, the current is measured in an integrated circuit. In some embodiments, this current may be measured prior to a burn-in test of the integrated circuit. For example, a standby leakage current may be measured during wafer sort. The leakage current may be measured at any level of granularity in the wafer or within the integrated circuit. For example, referring back to FIG. 1, the standby leakage current may be measured for all circuits 130 within integrated circuit 100. Also for example, referring to FIG. 2, standby leakage current may be measured on a circuit block by circuit block basis. As shown in FIG. 2, standby leakage current may be measured separately for circuit blocks 220 and 230.

Referring now back to FIG. 6, at 620 a temperature sensitive voltage generator is programmed. In some embodiments, this may correspond to programming a digital word storage apparatus to set a nominal output voltage of a temperature sensitive voltage generator. For example, various digital word storage apparatus shown in FIGS. 3-5 may be programmed at 620. They may be programmed using any technique capable of programming a digital word. For example, a scan chain through an integrated circuit or a wafer may be utilized to program registers, such as registers

510 (FIG. 5). Also for example, fuses may be blown in individual integrated circuits, or in individual regions of integrated circuits, to program the output of temperature sensitive voltage generators.

At 630, the output of the temperature sensitive voltage generator is selected to control leakage current. In some embodiments, this may correspond to setting a test signal, such as the test signal on node 202 (FIG. 2). Further, this may correspond to selecting a thermal feedback circuit to be included within the circuit.

At 640, a burn-in test of the integrated circuit is performed. In some embodiments, the burn-in test includes raising the temperature of the integrated circuit. Further, in some embodiments, the burn-in test may include increasing a power supply voltage on the integrated circuit. Further, the burn-in test may include a combination of increased temperature and increased power supply voltage. During the burn-in test, the thermal feedback mechanism provided by the temperature sensitive voltage generator may control leakage current and prevent thermal runaway during the burn-in test.

Figure 7:
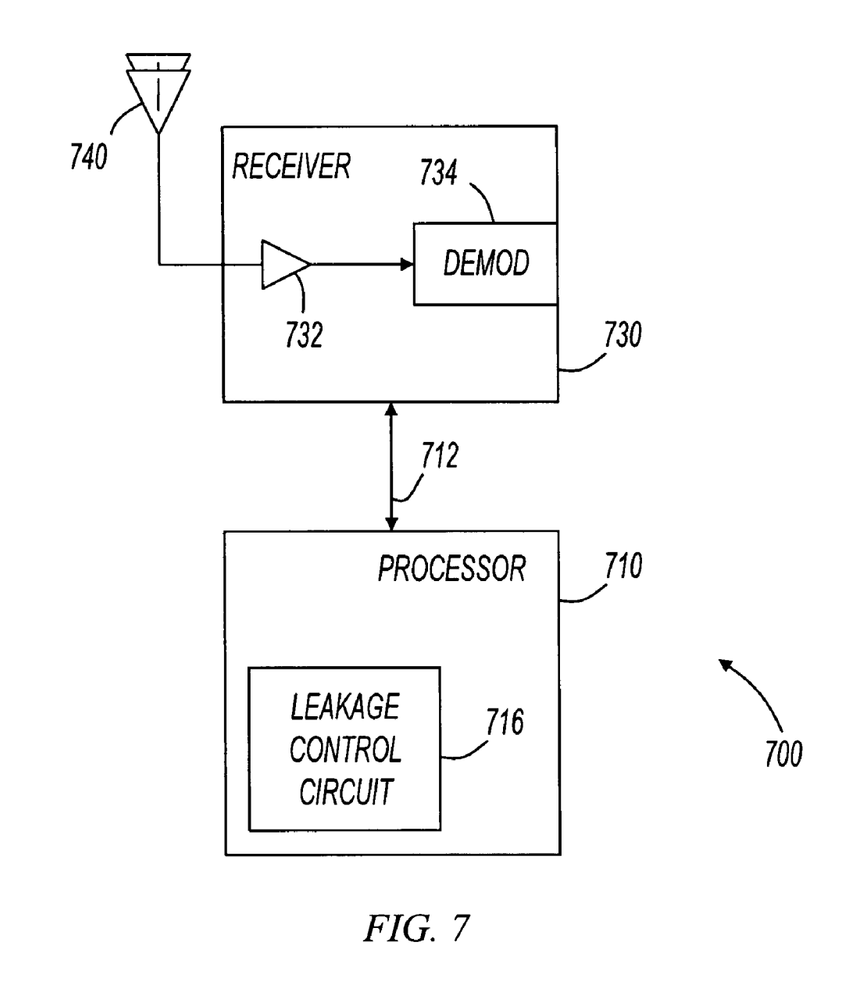
FIG. 7 shows a system diagram in accordance with various embodiments of the present invention.

FIG. 7 shows a system diagram in accordance with various embodiments of the present invention. FIG. 7 shows system 700 including processor 710, receiver 730, and antennas 740. Processor 710 includes leakage control circuit 716. Leakage control circuit 716 may include any of the leakage control mechanisms described above. For example, leakage control circuit 716 may include a temperature sensitive voltage generator as part of a thermal feedback circuit. Leakage control circuit 716 may be utilized to control leakage current of various circuits within processor 710. For example, leakage control circuit 716 may be used to control leakage current during normal operation, or may be used to control leakage current during a test such as a burn-in test.

In systems represented by FIG. 7, processor 710 is coupled to receiver 730 by conductor 712. Receiver 730 receives communications signals from antennas 740 and also communicates with processor 710 on conductor 712. In some embodiments, receiver 730 provides communications data to processor 710. Also in some embodiments, processor 710 provides control information to receiver 730 on conductor 712.

Example systems represented by FIG. 7 include cellular phones, personal digital assistants, wireless local area network interfaces, and the like. Many other systems uses for processor 710 exist. For example, processor 710 may be used in a desktop computer, a network bridge or router, or any other system without a receiver.

Receiver 730 includes amplifier 732 and demodulator (demod) 734. In operation, amplifier 732 receives communications signals from antennas 740, and provides amplified signals to demod 734 for demodulation. For ease of illustration, frequency conversion and other signal processing is not shown. Frequency conversion can be performed before or after amplifier 732 without departing from the scope of the present invention. In some embodiments, receiver 730 may be a heterodyne receiver, and in other embodiments, receiver 730 may be a direct conversion receiver. In some embodiments, receiver 730 may include multiple receivers. For example, in embodiments with multiple antennas 740, each antenna may be coupled to a corresponding receiver.

Receiver 730 may be adapted to receive and demodulate signals of various formats and at various frequencies. For example, receiver 730 may be adapted to receive time domain multiple access (TDMA) signals, code domain multiple access (CDMA) signals, global system for mobile communications (GSM) signals, orthogonal frequency division multiplexing (OFDM) signals, multiple-input-multiple-output (MIMO) signals, spatial-division multiple access (SDMA) signals, or any other type of communications signals. The various embodiments of the present invention are not limited in this regard.

Antennas 740 may include one or more antennas. For example, antennas 740 may include a single directional antenna or an omni-directional antenna. As used herein, the term omni-directional antenna refers to any antenna having a substantially uniform pattern in at least one plane. For example, in some embodiments, antennas 740 may include a single omni-directional antenna such as a dipole antenna, or a quarter wave antenna. Also for example, in some embodiments, antennas 740 may include a single directional antenna such as a parabolic dish antenna or a Yagi antenna. In still further embodiments, antennas 740 include multiple physical antennas. For example, in some embodiments, multiple antennas are utilized for multiple-input-multiple-output (MIMO) processing or spatial-division multiple access (SDMA) processing.

Although processor 710 and receiver 730 are shown separate in FIG. 7, in some embodiments, the circuitry of processor 710 and receiver 730 are combined in a single integrated circuit. Furthermore, receiver 730 can be any type of integrated circuit capable of processing communications signals. For example, receiver 730 can be an analog integrated circuit, a digital signal processor, a mixed-mode integrated circuit, or the like.

Although the present invention has been described in conjunction with certain embodiments, it is to be understood that modifications and variations may be resorted to without departing from the spirit and scope of the invention as those skilled in the art readily understand. Such modifications and variations are considered to be within the scope of the invention and the appended claims.

What is claimed is:

1. An integrated circuit comprising:
 a plurality of load circuits;
 a plurality of sleep transistors coupled between the plurality of load circuits and a power supply node to reduce current in the plurality of load circuits in response to a control signal; and
 a thermal feedback circuit to generate the control signal, wherein the thermal feedback circuit includes a temperature sensitive voltage generator that includes a temperature sensitive digital to analog converter and a digital word storage apparatus to provide a digital word to the digital to analog converter.

2. The integrated circuit of claim 1 further comprising a multiplexer to provide the control signal using either an output signal from the temperature sensitive voltage generator or a second siginal.

3. The integrated circuit of claim 2 wherein the second signal is a clock signal.

4. The integrated circuit of claim 1 wherein the digital word storage apparatus comprises a plurality of fused elements.

5. The integrated circuit of claim 1 wherein the digital word storage apparatus comprises a programmable memory.

6. The integrated circuit of claim 1 wherein the digital word storage apparatus comprises a scan register.

7. The integrated circuit of claim 1 wherein the thermal feedback circuit further includes an amplifier coupled to be driven by the temperature sensitive digital to analog converter.

8. An electronic system comprising:
an antenna;
a receiver circuit coupled to receive signals from the antenna; and
a processor operatively coupled to the receiver circuit, the processor comprising a plurality of load circuits, a plurality of sleep transistors coupled between the plurality of load circuits and a power supply node to reduce current in the plurality of load circuits in response to a control signal, a multiplexer to provide the control signal from a first or second signal, and a thermal feedback circuit to generate the first signal, wherein the thermal feedback circuit includes a temperature sensitive voltaae generator that includes a temperature sensitive digital to analog converter and a digital word storage apparatus to provide a digital word to the digital to analog converter.

9. The electronic system of claim 8 wherein the digital word storage apparatus comprises a plurality of fused elements.

10. The electronic system of claim 8 wherein the digital word storage apparatus comprises a programmable memory.

11. The electronic system of claim 8 wherein the digital word storage apparatus comprises a scan register.

12. The electronic system of claim 8 wherein the thermal feedback circuit further includes an amplifier coupled between an output of the digital to analog converter and an input of the multiplexer.

* * * * *

UNITED STATES PATENT AND TRADEMARK OFFICE
CERTIFICATE OF CORRECTION

PATENT NO. : 7,268,569 B2 Page 1 of 1
APPLICATION NO. : 11/027696
DATED : September 11, 2007
INVENTOR(S) : Vassighi et al.

It is certified that error appears in the above-identified patent and that said Letters Patent is hereby corrected as shown below:

In column 6, line 54, in Claim 2, delete "siginal." and insert -- signal. --, therefor.

In column 7, line 12, in Claim 8, after "signal" delete "." and insert -- , --, therefor.

In column 7, line 14, in Claim 8, delete "voltaae" and insert -- voltage --, therefor.

Signed and Sealed this

Twenty-ninth Day of April, 2008

JON W. DUDAS
*Director of the United States Patent and Trademark Office*